(12) United States Patent
Karszt et al.

(10) Patent No.: US 10,212,831 B2
(45) Date of Patent: Feb. 19, 2019

(54) ELECTRONIC CONTROL UNIT

(71) Applicant: Veoneer Sweden AB, Vårgårda (SE)

(72) Inventors: Norbert Karszt, Lohhof (DE);
Sebastian Hetzel, Dachau (DE)

(73) Assignee: VEONEER SWEDEN AB, Vargarda (SE)

(*) Notice: Subject to any disclaimer, the term of this patent is extended or adjusted under 35 U.S.C. 154(b) by 0 days.

(21) Appl. No.: 15/547,335

(22) PCT Filed: Feb. 2, 2016

(86) PCT No.: PCT/EP2016/052145
§ 371 (c)(1),
(2) Date: Jul. 28, 2017

(87) PCT Pub. No.: WO2016/124572
PCT Pub. Date: Aug. 11, 2016

(65) Prior Publication Data
US 2018/0014413 A1   Jan. 11, 2018

(51) Int. Cl.
H05K 5/00    (2006.01)
H05K 5/03    (2006.01)
H05K 5/06    (2006.01)
H05K 7/20    (2006.01)

(52) U.S. Cl.
CPC .......... *H05K 5/0017* (2013.01); *H05K 5/006* (2013.01); *H05K 5/0013* (2013.01); *H05K 5/0052* (2013.01); *H05K 5/03* (2013.01); *H05K 5/061* (2013.01); *H05K 7/20854* (2013.01)

(58) Field of Classification Search
CPC ............ H05K 5/0017; H05K 5/0013; H05K 5/0047–5/006; H05K 5/00; H05K 5/02; H05K 5/03; H05K 5/0217; H05K 7/20854; H05K 7/20; H05K 7/2039; H05K 7/209; H05K 7/2049; H01L 23/4039; Y10T 29/49822; H02G 3/088; H02G 3/16
USPC .... 361/707, 752, 736; 174/521, 50, 58, 16.3
See application file for complete search history.

(56) References Cited

U.S. PATENT DOCUMENTS

| | | | | |
|---|---|---|---|---|
| 4,130,327 A | * | 12/1978 | Spaulding | H01R 13/6275 439/331 |
| 5,486,816 A | * | 1/1996 | Ariga | G08B 17/107 250/574 |
| 6,370,026 B2 | * | 4/2002 | Sunaga | H01L 23/4093 257/719 |
| 7,383,029 B2 | * | 6/2008 | Sasaki | H04B 1/0346 361/752 |

(Continued)

FOREIGN PATENT DOCUMENTS

EP   0 113 073 A1   7/1984
EP   1 895 823 A1   5/2008

OTHER PUBLICATIONS

International Search Report and Written Opinion of PCT/EP2016/052145, dated Apr. 14, 2016.

Primary Examiner — Dion R Ferguson
Assistant Examiner — Amir Jalali
(74) Attorney, Agent, or Firm — Brinks Gilson & Lione

(57) ABSTRACT

An electronic control unit having a housing containing a circuit board. The housing includes a base and a cover between which the circuit board is located, and the unit being characterized in that the base and the cover are connected to one another via interference fit interengagement around at least a major part of a peripheral edge of the cover.

17 Claims, 5 Drawing Sheets

(56) References Cited

U.S. PATENT DOCUMENTS

| | | | | |
|---|---|---|---|---|
| 7,513,381 | B2* | 4/2009 | Heng | B65D 43/022 |
| | | | | 215/359 |
| 9,545,032 | B2* | 1/2017 | Baer | H05K 7/20436 |
| 2009/0153314 | A1* | 6/2009 | Young | B60K 35/00 |
| | | | | 340/438 |
| 2009/0175020 | A1* | 7/2009 | Zadesky | G06F 1/1626 |
| | | | | 361/818 |
| 2010/0044169 | A1* | 2/2010 | Farooq | F16D 55/22655 |
| | | | | 188/73.44 |
| 2013/0215582 | A1* | 8/2013 | Dittrich | H05K 5/0026 |
| | | | | 361/752 |
| 2014/0334115 | A1* | 11/2014 | Yang | H05K 7/1427 |
| | | | | 361/752 |
| 2015/0092437 | A1* | 4/2015 | Arita | F21V 15/01 |
| | | | | 362/546 |

* cited by examiner

ELECTRONIC CONTROL UNIT

CROSS-REFERENCE TO RELATED APPLICATIONS

This application is a 35 U.S.C. § 371 National Phase Application of PCT/EP2016/052145, filed Feb. 2, 2016, which claims the benefit of priority to European Patent Application Serial No.: 15153702.4, filed Feb. 3, 2015, the contents of which are incorporated herein by reference in their entirety.

FIELD OF THE INVENTION

The present invention relates to an electronic control unit, and more particularly to an electronic control unit of a type having a housing containing a circuit board.

Although the electronic control unit of the present invention has been found to be particularly suitable for use in the environment of a motor vehicle, and will thus be described with particular reference to that technical area, it is to be appreciated that the present invention is not limited to the field of motor vehicles.

BACKGROUND

Modern motor vehicles are equipped with a vast array of electronic circuitry to manage operation of the vehicle and to ensure the safety of occupants in the case of an accident. For example, the use of airbags is now common and airbag systems require sophisticated electronics to monitor the motion of the motor vehicle to ensure that the airbags are properly deployed, and deployed in an appropriate manner to provide protection in a given accident situation. Furthermore, so called active safety systems such as adaptive cruise control systems, forward collision warning and braking systems, blind spot monitoring systems, and lane departure warning systems are becoming increasingly common and all require sophisticated electronic circuitry. A modern motor vehicle therefore includes a significant number of electronic control units (ECUs).

In the environment of a motor vehicle, it is important for ECUs to be adequately sealed in order to prevent environmental influences (such as the ingress of water, dust etc.) from affecting ECU performance. Additionally, it can be advantageous in many installations to ensure that ECUs provide good heat dissipation from their internal circuit boards, and to ensure that the circuit boards are securely retained in position, noting that there are usually very considerable vibrations occurring during operation of a motor vehicle.

Additionally, motor vehicle manufacturers are continuously striving to reduce the componentry of their vehicles, which means that producers of various electronic systems for installation in motor vehicles are generally striving to reduce the cost involved in their production, and to simplify their production.

It is an object of the present invention to provide an improved electronic control unit, which may be suitable for use in a motor vehicle.

According to the present invention, there is provided an electronic control unit having a housing containing a circuit board, wherein the housing comprises a base and a cover between which the circuit board is located, the unit being characterised in that the base and the cover are inter-engaged via an interference fit connection extending around at least a major part of a peripheral edge of the cover.

Preferably, the interference fit connection involves elastic deformation of said cover around its peripheral edge.

Advantageously, the cover is resiliently deformable.

Conveniently, the peripheral edge of the cover engages an inwardly directed surface of the base.

Advantageously, the peripheral edge of the cover is received within a groove formed around the base as a snap-fit.

Optionally, the groove is formed around the inwardly directed surface.

Preferably, the circuit board is clampingly engaged between said base and said cover.

Conveniently, a first side of the circuit board contacts the base, and an opposing second side of the circuit board contacts the cover.

Advantageously, the first and second sides of the circuit board respectively contact the base and the cover around a peripheral region of the circuit board.

Preferably, the second side of the circuit board contacts a re-entrant region of the cover which is depressed inwardly of the base.

Conveniently, the re-entrant region of the cover is spaced inwardly of the peripheral edge of the cover.

Advantageously, the unit further comprises a peripheral seal adjacent the interference fit inter-engagement.

Preferably, the seal extends around the circuit board, and is located between the peripheral edge of the cover and the re-entrant region of the cover.

Conveniently, both the base and the cover are formed of heat conductive material.

Advantageously, at least a major part of the peripheral edge of the cover is rounded.

Optionally, the peripheral edge of the cover has a shape comprising rounded corners.

BRIEF DESCRIPTION OF THE DRAWINGS

So that the invention may be more readily understood, and so that further features thereof may be appreciated, embodiments of the invention will now be described by way of example with reference to the accompanying drawings in which.

DETAILED DESCRIPTION

Figure 1:
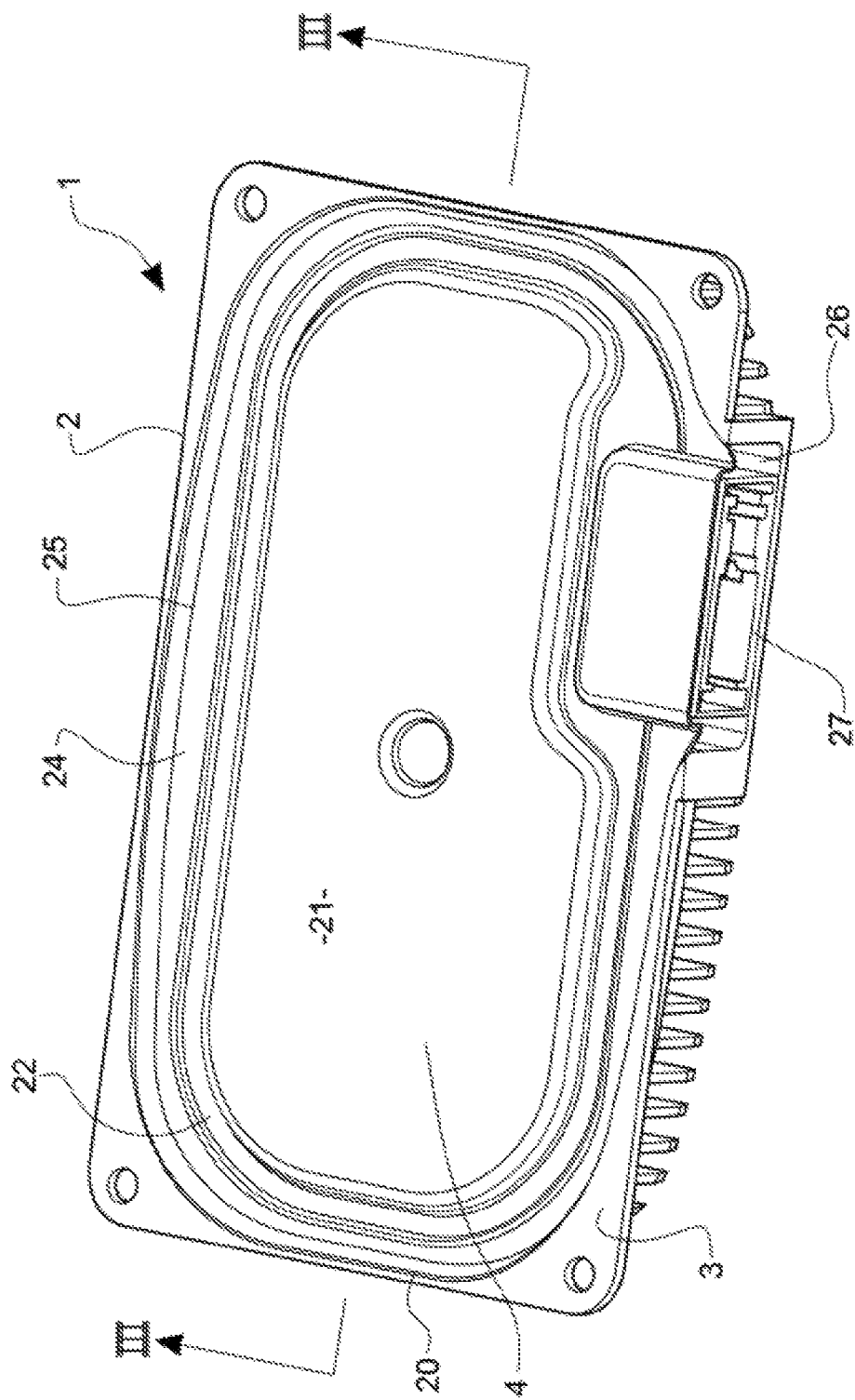
FIG. 1 is a perspective view from below of an electronic control unit in accordance with the present invention.
Figure 2:
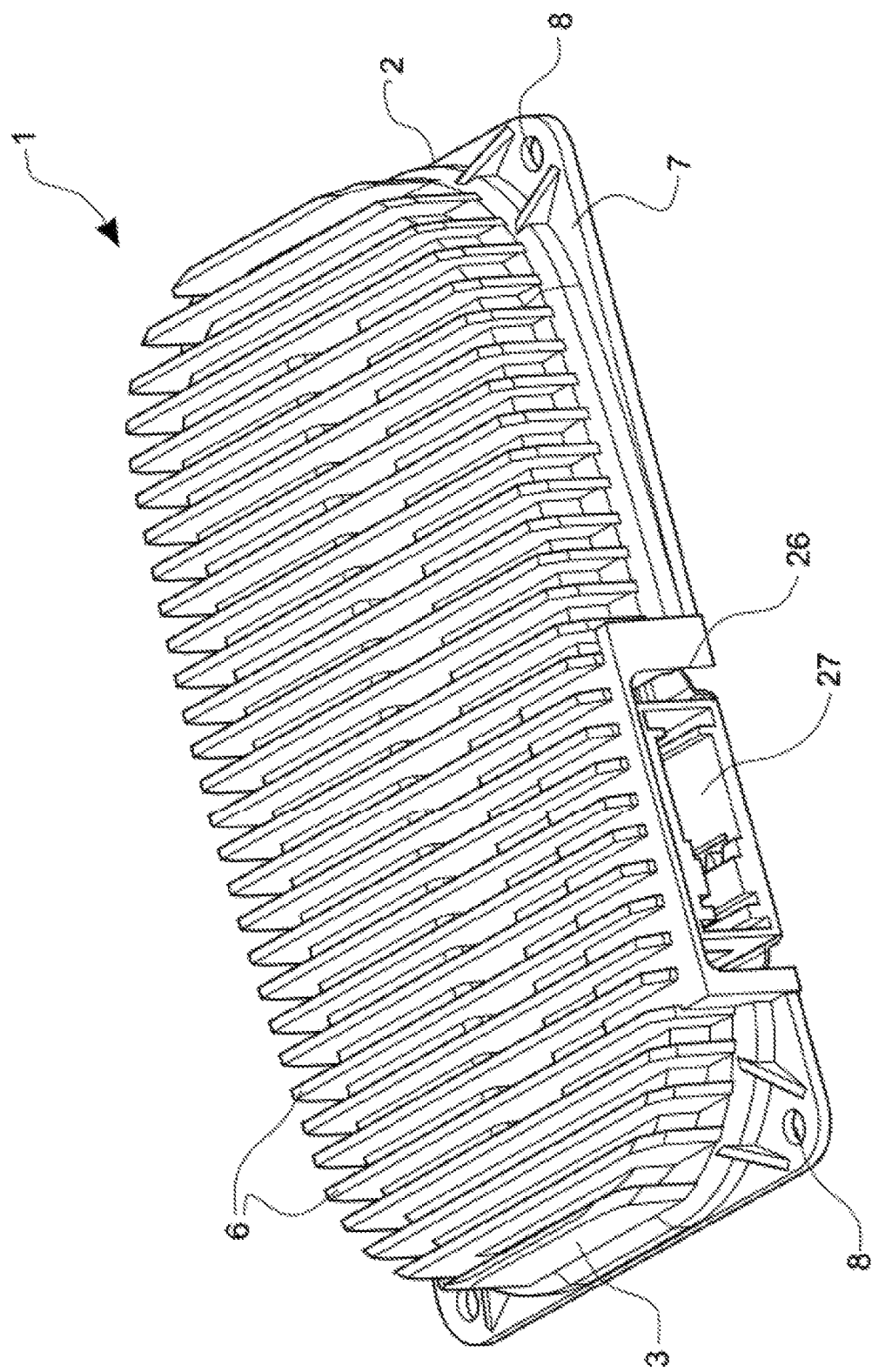
FIG. 2 is a perspective view from above of the unit illustrated in FIG. 1.

Turning now to consider the drawings in more detail, FIGS. 1 and 2 illustrate an electronic control unit (ECU) 1 in accordance with an embodiment of the present invention. The ECU has a housing 2 which includes a base 3 and a cover 4 which are inter-engaged to form the housing 2. As illustrated most clearly in FIG. 3, the housing 2 of the ECU 1 contains a circuit board 5 which may be, for example, a printed circuit board in the conventional manner.

Both the base 3 and the cover 4 of the housing 2 are formed from a material having good thermal conductivity properties. Some embodiments are configured such that the base 3 and the cover 4 are formed of metal, although it is to be appreciated that other heat conductive materials could be used instead of metal. The base 3 and the cover 4 may both be formed from the same material. However, the base 3 is configured to be substantially rigid while the cover 4 is configured so as to be resiliently deformable, and so they may be formed from different materials in order to achieve these characteristics.

As illustrated most clearly in FIG. 2, the outside of the base 3, on its side opposite the cover 4, is provided with a plurality of integrally formed and spaced-apart heat sink fins 6 in order to improve dissipation of heat generated by the circuit board 5 to the surrounding atmosphere. The base 3 also has a peripheral mounting flange 7 with a plurality of mounting apertures 8 to facilitate its connection to a suitable mounting structure, for example in a motor vehicle.

Figure 3:
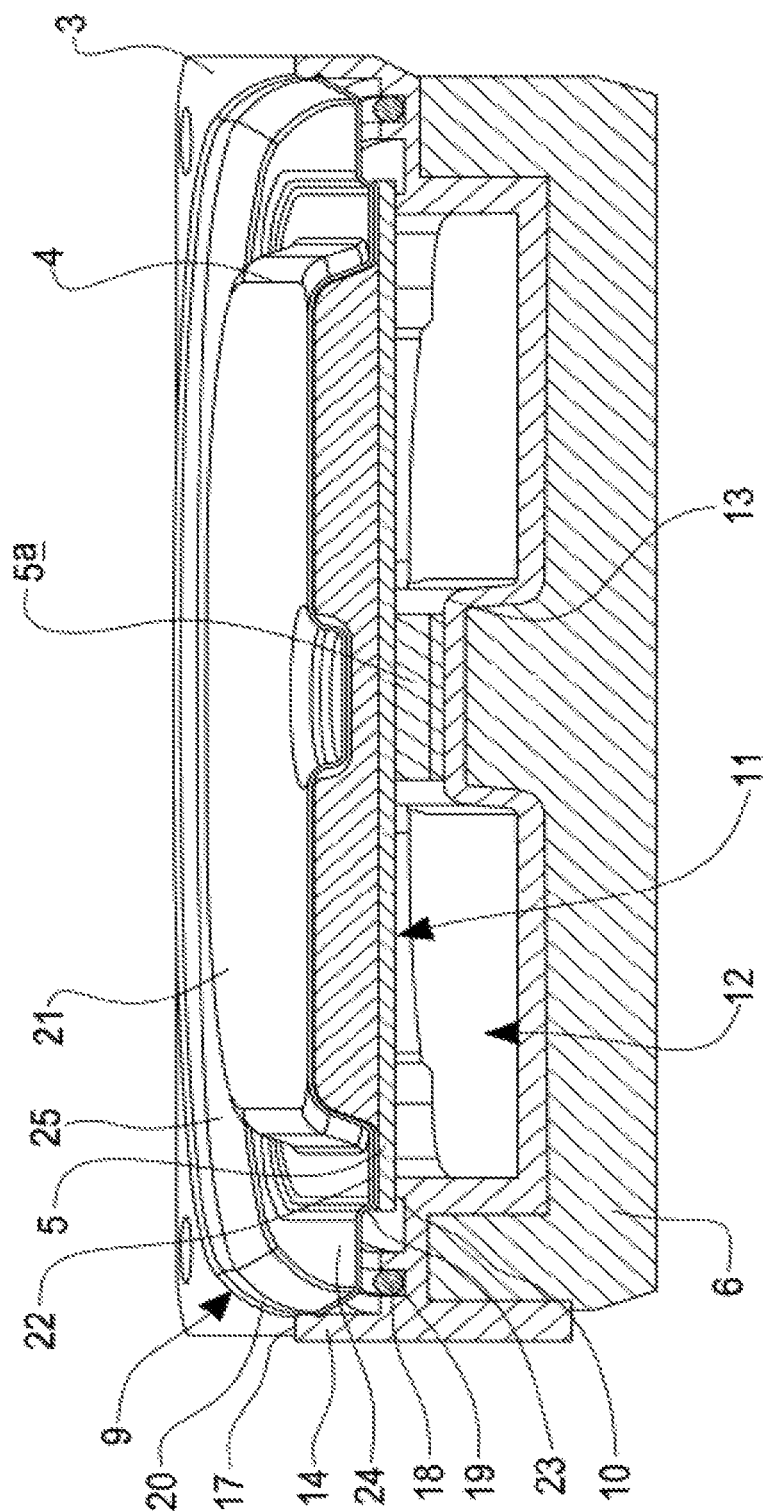
FIG. 3 is a cross-sectional view through the unit, taken along line III-III in FIG. 1.

As illustrated in FIG. 3, the base 3 defines a recessed opening 9 through which the circuit board 5 may be inserted so as to be positioned within an interior volume of the housing 2 which is formed when the base 3 and the cover 4 are inter-engaged. More particularly, it will be noted that the base presents an upstanding (in the orientation illustrated in FIG. 3) support ring 10 which extends generally around the interior volume inside the recessed opening 9 and on which the circuit board 5 is supported around its peripheral region. As will thus be appreciated, the underside surface 11 of the circuit board 5 contacts the base 3 around the support ring 10, but is otherwise spaced from the inner surfaces of the base 3 so that a void 12 is formed between the majority of the circuit board 5 and the base 3 within the support ring 10. However, the base 3 may include an upstanding central formation 13 in order to provide additional support to a central region of the circuit board 5 or to an electrical component 5a mounted to the circuit board as illustrated in FIG. 3.

Figure 4:
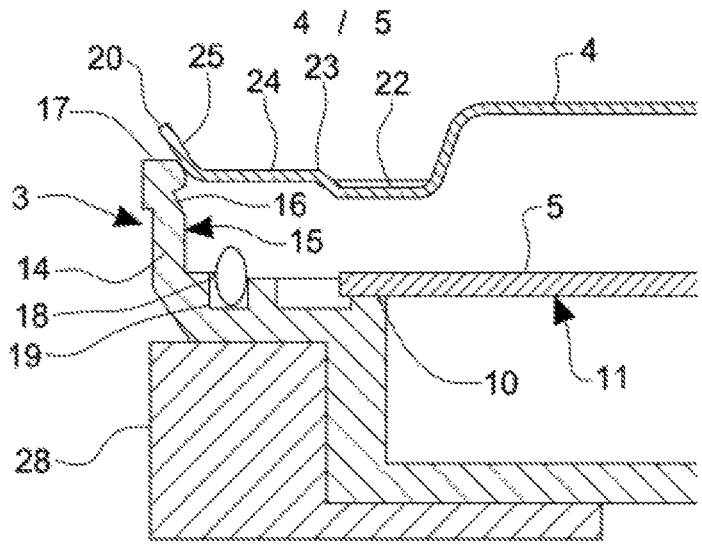
FIG. 4 is an enlarged cross-sectional view, similar to that of FIG. 3, but which shows only part of the unit and which illustrates an initial step in the assembly of the unit.
Figure 5:
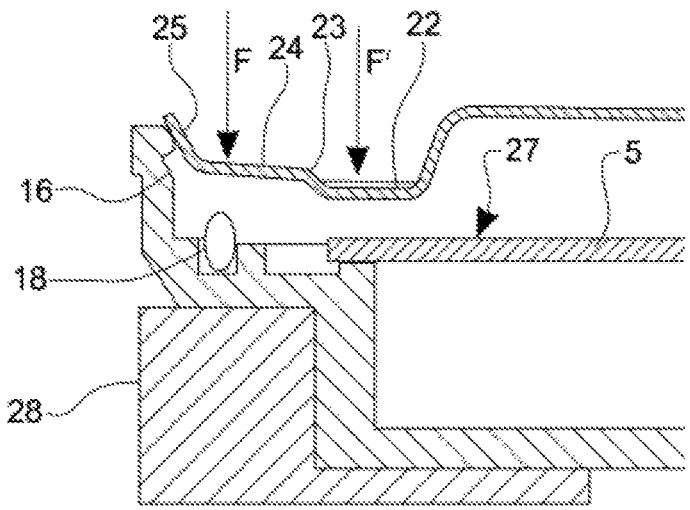
FIG. 5 is a view corresponding to that of FIG. 4, but which illustrates a subsequent step in the assembly of the unit.
Figure 6:
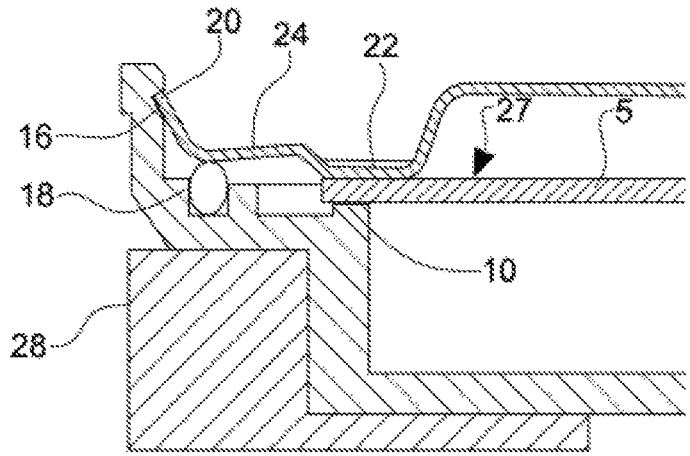
FIG. 6 is another view corresponding to those of FIGS. 4 and 5, but which illustrates a final step in the assembly of the unit.

As illustrated most clearly in FIGS. 3 and 4 to 6, the opening 9 of the base 3 is defined by a peripheral sidewall 14 which defines an inwardly directed surface 15. A peripheral groove 16 is preferably formed in and around the sidewall 14 as illustrated in FIGS. 4 to 6, at a position spaced slightly below the upper edge 17 of the sidewall 14. Additionally, the ECU 1 may include a peripheral seal 18, such as an elastomeric O-ring type seal, which is seated in a seal recess 19 provided in the base 3 adjacent the sidewall 14, but spaced below the upper edge 17 and the groove 16. The seal 18 thus extends around the outside of the peripheral edge of the circuit board 5 in spaced relation thereto.

Turning now to consider the cover 4 in more detail, it will immediately be noted that the cover 4 is sized and shaped to be received within the recessed opening 9 of the base 3, to thereby close the interior volume of the housing 2 with the circuit board 5 located therein and between the base 3 and the cover 4. In this regard it will be noted that the cover 4 has a shape defined by its peripheral edge 20 which is generally rectangular but with rounded corners. It is envisaged that in other embodiments the cover 4 may have a generally oval shape, which will thus also be rounded. The peripheral sidewall 14 of the base 3 thus has a corresponding shape in order to ensure intimate contact with the peripheral edge 20 of the cover 4 around at least a major extent of its length.

As indicated above, the cover 4 is formed of a heat conductive material such as metal. Additionally, it is to be noted that the cover is configured so as to be resiliently deformable. It is therefore envisaged that the cover 4 may be pressed from metal plate.

As illustrated most clearly in FIGS. 1 and 2, the cover has a relatively large central region 21 which may be substantially planar. Around the central region 21 there is provided a re-entrant region 22 which is depressed inwardly of the base 3 when the cover 4 is fitted to the base 3 as illustrated in FIGS. 1 and 3 and as will be described in more detail hereinbelow. As will be noted, the re-entrant region 22 of the cover is spaced inwardly of the peripheral edge 20 of the cover 4.

The outermost extent of the re-entrant region 22 is defined by an upturned bend in the metal of the cover which defines a small shoulder 23 between the re-entrant region 22 and a planar region 24 around the outside of the re-entrant region. In the peripheral region of the cover 4, there is defined an upturned lip 25 which terminates in the peripheral edge 20 of the cover 4.

As illustrated in FIGS. 1 and 2, the sidewall 14 of the base 3 may include an opening 26 to accommodate an electrical connector 27 affixed to the circuit board 5 in order to facilitate electrical connection of the ECU to other circuitry.

Turning now to consider FIGS. 4 to 6, the manner in which the base 3 and the cover 4 are inter-engaged will now be described in more detail. These Figures all show the circuit board 5 supported around its periphery by the support ring 10 of the base 3, such that the underside surface 11 of the circuit board 5 is in contact with the support ring 10.

FIG. 4 shows the cover 4 positioned above the base 3 prior to engagement with the base 3, and thus shows the cover in its natural, relaxed and un-deformed, condition. As will be noted, in this condition, the cover 4 is too large to fit inside the opening 9 of the base as defined by its peripheral sidewall 14. The upturned flange 25 of the cover 4 thus rests against the upper edge of the base sidewall 14. Additionally, it is to be noted that the base 3 is shown received within a supporting tool 28.

In order to inter-engage the base 3 and the cover 4, the cover 4 is pressed downwardly towards the base. This may be achieved by applying downwards pressure via a pressing tool configured to bear against the upper surface of the planar region 24 of the cover, preferably around the entire extent of the cover 4, so as to apply a downwards force F to the cover as denoted by arrow F in FIG. 5. Alternatively, however, the cover 4 may be pressed downwardly towards the base 3 by applying downwards pressure via a pressing tool configured to bear instead against the re-entrant region 22 of the cover, preferably around the entire extent of the re-entrant region, so as to apply a downwards force to the cover as denoted by arrow F' in FIG. 5. In either case, the applied downwards pressure is thus effective to urge the cover 4 towards the base 3. In more detail, and as shown in FIG. 5, because of the inherent deformability of the cover 4, and the relative rigidity of the base 3, the peripheral region of the cover 4 will thus be elastically and plastically deformed as the upturned flange 25 is forced past the upper edge 17 of the sidewall 14. This may be further facilitated by the provision of a chamfer on the inside of the upper edge 17 as illustrated.

The cover 4 is thus deformed by bending about the connection between the upturned flange 25 and the planar region 24, and by bending about the shoulder 23 between the planar region 24 and the re-entrant region 22.

Continued application of the downwards pressing force F pushes the cover 4 downwardly into the recessed opening 9 of the base 3 until the peripheral edge 20 of the cover moves past the groove 16 in the sidewall 14, whereupon the inherent resiliency of the cover 4 causes the peripheral edge 20 to spring outwardly into engagement with the groove as snap fit, as illustrated in FIG. 6. Nevertheless, even when the peripheral edge 20 of the cover is engaged in the groove 16 in this manner, the cover will still be elastically deformed on account of having been pressed into the smaller opening 9 of the base 3. The base 3 and the cover 4 are thus inter-engaged via an interference fit connection which extends around the peripheral edge 20 of the cover 4 such that the peripheral edge 20 is pressed into intimate engagement with the groove 16. The connection is therefore substantially watertight around its entire extent.

Nevertheless, as illustrated in FIG. 6, when the peripheral edge 20 of the cover 4 is received in the groove 16, the planar region 24 of the cover engages and bears against the seal 18, causing a slight deformation of the seal 18. This supplements the substantially watertight seal provided by the interference fit connection between the peripheral edge 20 of the cover 4 and the groove 16.

Furthermore, as also illustrated in FIG. 6, when the cover 4 is fully engaged with the base 3 as described above, the undersurface of the re-entrant region 22 of the cover contacts and bears down on the upper surface 27 of the circuit board 5, around the peripheral region of the circuit board 5, thereby clamping the peripheral region of the circuit board securely between the support ring 10 of the base 3 and the re-entrant region 22 of the cover 4.

The ECU of the present invention thus provides for very simple and convenient inter-engagement between the base 3 and the cover 4 of the housing 2, which additionally provides good protection against the ingress of water into the housing 2 between the base 3 and the cover 4, whilst also ensuring that the circuit board 5 is securely held in position within the housing 2.

Figure 7:
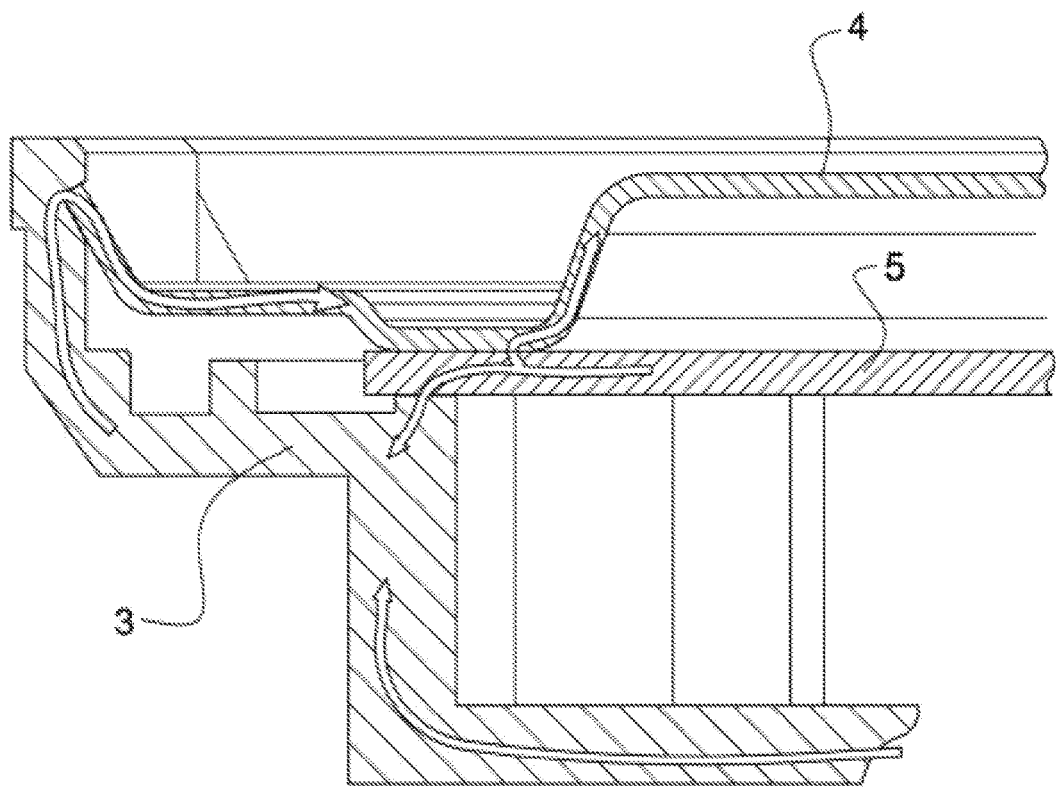
FIG. 7 is a view similar to that of FIG. 4, and which shows schematically a heat dissipation function of the assembled unit.

However the ECU of the present invention also offers additional benefits in terms of heat dissipation. Having regard to FIG. 7, the arrows illustrate schematically the dissipation of heat from the circuit board 5 into both the cover 4 and the base 3 by virtue of its direct contact with both and the fact that the base 3 and the cover 4 are both made from heat conductive material.

Whilst the invention has been described above with reference to a specific embodiment, it is to be appreciated that various modifications can be made without departing from the scope of the claimed invention. For example, in some variants it is envisaged that the interengagement between the peripheral edge 20 of the cover 4 and the peripheral groove 16 in the sidewall 14 of the base 3 can be further secured by a process of mechanical caulking (plastic deformation) in which the upper edge 17 of the sidewall 14 of the base is stamped or otherwise deformed at a plurality of positions spaced-apart around the periphery of the upper edge 17. These spaced-apart deformations can be created, for example, by sharply driving a blunt tool downwardly against the upper edge 17 of the sidewall 14 in order to displace the material of the base 3 locally into even tighter mechanical engagement with the peripheral edge 20 of the cover, thereby effectively locking the peripheral edge 20 of the cover 4 into tight engagement with the groove 16 formed around the sidewall 14 of the base 3.

It is also proposed that in some embodiments the groove 16 formed around the sidewall 14 of the base 3 could be discontinuous so as to form a series of discrete groove portions spaced-apart around the sidewall 14 rather than a single entirely peripheral groove as described above.

As indicated above, whilst in preferred embodiments the base 3 and the cover 4 are both made from metal, other heat conductive materials could be used instead. For example, the base 3 and/or the cover 4 could be formed from plastics material (such as fiber-reinforced plastic) having a plurality of metal particles (such as aluminium particles) distributed therein in order to provide appropriate heat conductive properties. It is envisaged that in some embodiments the base 3 could be formed from this type of conductive plastic material, whilst the cover 4 could be formed from metal.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

While the above description constitutes the preferred embodiment of the present invention, it will be appreciated that the invention is susceptible to modification, variation and change without departing from the proper scope and fair meaning of the accompanying claims.

The invention claimed is:

1. An electronic control unit having a housing containing a circuit board, wherein the housing comprises:
    a base and a cover between which the circuit board is located;
    the base and the cover are inter-engaged via an interference fit connection extending around at least a major part of a peripheral edge of the cover;
    wherein a first side of the circuit board contacts the base;
    wherein the cover contacts and bears down on an opposing second side of the circuit board such that the circuit board is clamped between the base and the cover by the cover;
    the interference fit connection includes an elastic deformation of the cover; and
    wherein the peripheral edge of the cover engages the base at an angle and the peripheral edge extends from the base towards the circuit board at the angle.

2. The unit according to claim 1, wherein the elastic deformation of the cover is around the peripheral edge of the cover.

3. The unit according to claim 1, further comprising the peripheral edge of the cover engages an inwardly directed surface of the base.

4. The unit according to claim 1, further comprising the peripheral edge of the cover is received within a groove formed around the base as a snap-fit.

5. The unit according to claim 4, further comprising the groove is formed around an inwardly directed surface of the base.

6. The unit according to claim 1, further comprising the first and second sides of the circuit board respectively contact the base and the cover around a peripheral region of the circuit board.

7. The unit according to claim 1, further comprising the second side of the circuit board contacts a re-entrant region of the cover which is depressed inwardly of the base.

8. The unit according to claim 7, further comprising the re-entrant region of the cover is spaced inwardly of the peripheral edge of the cover.

9. The unit according to claim 1, further comprising a peripheral seal adjacent the interference fit connection.

10. The unit according to claim 9, further comprising the seal extends around the circuit board, and is located between the peripheral edge of the cover and a re-entrant region of the cover which is depressed inwardly of the base.

11. The unit according to claim 1, further comprising both the base and the cover are formed of a heat conductive material.

12. The unit according to claim 1, further comprising at least a major part of the peripheral edge of the cover is rounded.

13. The unit according to claim 1, further comprising the peripheral edge of the cover has a shape as rounded corners.

14. The unit according to claim 1, further comprising at least one of the first and second sides of the circuit board contact respectively the base and the cover in a heat conducting engagement.

15. The unit according to claim 14, wherein both the first and second sides of the circuit board contact respectively the base and the cover in the heat conducting engagement.

16. An electronic control unit having a housing containing a circuit board, wherein the housing comprises:
   a base and a cover between which the circuit board is located;
   the base and the cover are inter-engaged via an interference fit connection extending around at least a major portion of a peripheral edge of the cover;
   the circuit board forming opposed first and second sides wherein the circuit board is clamped between the base and the cover by the cover when the base and the cover are inter-engaged and the second side of the circuit board is clamped into contact with the cover;
   wherein at least a contact of the first side of the base and a contact of the second side of the circuit board and the cover is a heat conducting contact;
   the interference fit connection includes an elastic deformation of the cover; and
   wherein the peripheral edge of the cover engages the base at an angle and the peripheral edge extends from the base towards the circuit board at the angle.

17. The unit according to claim 16, further comprising both of the contacts between the circuit board first and second sides and the base and the cover respectively are heat conducting contacts.

* * * * *